(12) United States Patent
Limdulpaiboon et al.

(10) Patent No.: US 9,245,793 B2
(45) Date of Patent: Jan. 26, 2016

(54) PLASMA TREATMENT OF LOW-K SURFACE TO IMPROVE BARRIER DEPOSITION

(71) Applicant: Intermolecular, Inc., San Jose, CA (US)

(72) Inventors: Ratsamee Limdulpaiboon, San Jose, CA (US); Frank Greer, Pasadena, CA (US); Chi-I Lang, Cupertino, CA (US); J. Watanabe, San Jose, CA (US); Wenxian Zhu, E. Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 19 days.

(21) Appl. No.: 14/135,182

(22) Filed: Dec. 19, 2013

(65) Prior Publication Data

US 2015/0179509 A1    Jun. 25, 2015

(51) Int. Cl.
*H01L 21/31* (2006.01)
*H01L 21/768* (2006.01)
*H01L 21/3105* (2006.01)
*H01J 37/32* (2006.01)

(52) U.S. Cl.
CPC ..... *H01L 21/76841* (2013.01); *H01J 37/32357* (2013.01); *H01J 37/32449* (2013.01); *H01L 21/3105* (2013.01)

(58) Field of Classification Search
CPC .................. H01L 21/02274; H01L 21/02126; H01L 21/0234; H01L 21/02323; H01L 21/76828; H01L 21/02337; H01L 21/3105; H01L 21/76841; H01J 37/32357; H01J 37/32449

USPC ........................................... 438/785, 785.778
See application file for complete search history.

(56) References Cited

U.S. PATENT DOCUMENTS

| | | | |
|---|---|---|---|
| 6,365,502 B1 | 4/2002 | Paranjpe et al. | |
| 6,613,695 B2 | 9/2003 | Pomarede et al. | |
| 7,041,596 B1 | 5/2006 | Dalton et al. | |
| 7,682,946 B2 | 3/2010 | Ma et al. | |
| 7,780,793 B2 | 8/2010 | Yang et al. | |
| 7,871,678 B1 | 1/2011 | Greer et al. | |
| 8,053,372 B1 | 11/2011 | Greer et al. | |
| 2002/0098684 A1* | 7/2002 | Li et al. | 438/630 |
| 2003/0064607 A1* | 4/2003 | Leu et al. | 438/780 |
| 2004/0151844 A1* | 8/2004 | Zhang et al. | 427/569 |
| 2006/0205235 A1* | 9/2006 | Wang et al. | 438/785 |
| 2007/0107750 A1 | 5/2007 | Sawin et al. | |
| 2008/0076268 A1* | 3/2008 | Kraus | H01L 21/28185 438/785 |
| 2008/0142483 A1* | 6/2008 | Hua | C23C 16/045 216/67 |
| 2010/0055342 A1 | 3/2010 | Chiang et al. | |
| 2012/0009802 A1 | 1/2012 | LaVoie et al. | |
| 2012/0219824 A1* | 8/2012 | Prolier et al. | 428/662 |

\* cited by examiner

*Primary Examiner* — Duy T Nguyen (57) ABSTRACT

Methods and apparatus for processing using a remote plasma source are disclosed. The apparatus includes an outer chamber enclosing a substrate support, a remote plasma source, and a showerhead. A substrate heater can be mounted in the substrate support. A transport system moves the substrate support and is capable of positioning the substrate. The plasma system may be used to generate activated species. The activated species can be used to treat the surfaces of low-k and/or ultra low-k dielectric materials to facilitate improved deposition of diffusion barrier materials.

14 Claims, 10 Drawing Sheets

|  | Typical Range | Advantageous Range |
|---|---|---|
| Temperature (C) | 25 - 500 | 100 - 300 |
| Ar flow rate (sccm) | 10 - 1000 | 250 - 750 |
| H2 flow rate (sccm) | 10 - 100 | 10 - 50 |
| O2 flow rate (sccm) | 10 - 500 | 50 - 200 |
| NH3 flow rate (sccm) | 10 - 100 | 10 - 50 |
| NF3 flow rate (sccm) | 2 - 100 | 2 - 20 |
| Pressure (Torr) | .05 - 5 | .05 - 2 |
| Time (min) | .25 - 60 | 5 - 40 |
| RF Power (W) | 200 - 2000 | |

PLASMA TREATMENT OF LOW-K SURFACE TO IMPROVE BARRIER DEPOSITION

TECHNICAL FIELD

The present disclosure relates generally to methods and apparatuses for processing using a remote plasma source for surface treatment, cleaning, and layer formation.

BACKGROUND

Plasmas are widely used for a variety of treatment and layer deposition tasks in semiconductor fabrication and other thin film applications. These applications include subtractive processes such as wafer precleaning, contaminant removal, native oxide removal, photoresist removal, plasma etching, as well as treatment processes such as oxidation, nitridation, or hydridation of a layer both during and after formation. "Remote" plasma sources are frequently used, where the plasma is located at some distance from the surface to be treated or substrate on which a layer is being formed. The distance allows some filtering of the charged particles in the plasma. For example, the density of electrons and ions can be adjusted or removed from the generated plasma.

Logic devices are increasingly using low-k dielectric materials as the inter-metal dielectric layer in advanced circuits. The low-k dielectric materials may include materials that have a dielectric constant of less than 3.9. Logic devices typically use copper as the conductor for the interconnections between circuits and/or circuit elements. Copper is a fast diffuser and requires the use of a barrier material to retard the diffusion of the copper through the dielectric materials. The diffusion barrier materials are typically deposited using techniques such as physical vapor deposition (PVD), and more recently, atomic layer deposition (ALD) has become attractive due to its ability to deposit materials in small space dimensions. The interaction of the deposition precursors is sensitive to the chemical species present at the surface of the dielectric material. In some cases, the interaction of the deposition precursors and the surface of the dielectric material is weak. This may lead to reduced deposition during the initial cycles of the ALD process. Further, the interactions may vary over time, leading to inconsistent results and poor control in a manufacturing environment.

What is needed is a system and methods that enable the repeatable and controllable deposition of thin films used in the manufacture of microelectronic devices, such as the use of direct or remote plasmas to condition the surface of dielectric materials present on semiconductor surfaces prior to further processing.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Methods and apparatus for processing using a plasma source for the treatment of dielectric material surfaces are disclosed. The apparatus includes an outer vacuum chamber enclosing a substrate support, a plasma source (either a direct plasma or a remote plasma), and an optional showerhead. Other gas distribution and gas dispersal hardware may also be used. A substrate heater can be mounted in the substrate support. A transport system moves the substrate support and is capable of positioning the substrate. The plasma source may be used to generate activated species operable to alter the surface of dielectric materials. Further, the plasma source may be used to generate activated species operable to provide a passivation of the dielectric material surface.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, germanium, silicon-germanium alloys, gallium arsenide, indium gallium arsenide, indium gallium antimonide, silica, sapphire, zinc oxide, silicon carbide, aluminum nitride, Spinel, coated silicon, silicon on oxide, silicon carbide on oxide, glass, gallium nitride, indium nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

The term "remote plasma source" as used herein refers to a plasma (e.g., a radio frequency (RF), microwave, direct current (DC), or pulsed DC generated plasma) located at a distance from a deposition or treatment location sufficient to allow some filtering of the plasma components. For example, the density of ions and electrons can be adjusted by distance, and electrons and ions can also be filtered out using suitable electrode configurations, such as a grounded metal showerhead so that only atomic or molecular radicals reach the substrate.

The terms "low-k", "low-k material", "low-k layer", and "low-k film" will be understood to be equivalent, will be used interchangeably herein, and will be understood to describe materials, layers, or films that exhibit a dielectric constant (k) that is lower than silicon dioxide (i.e. $SiO_2$ has a k value of 3.9).

The terms "ultra low-k", "ultra low-k material", "ultra low-k layer", and "ultra low-k film" will be understood to be equivalent, will be used interchangeably herein, and will be understood to describe materials, layers, or films that exhibit a dielectric constant (k) that is lower than 2.5.

The term "inter-metal dielectric, abbreviated as (IMD)" will be understood to describe the dielectric material used to separate metal conductors (e.g. portions of one or more interconnect structures) within the microelectronic device and/or circuit.

The term "nucleation delay" will be understood to describe the number of initial cycles during an atomic layer deposition process where essentially no material is deposited. The nucleation delay is determined by fitting a straight line through data representing film thickness (or a film thickness surrogate measurement such as XRF counts) versus number of cycles. The nucleation delay is the point where the fitted line crosses the x-axis.

Those skilled in the art will appreciate that each of the layers discussed herein may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the device interconnect structure, ALD, PE-ALD, AVD, or CVD are preferred methods of formation. However, any of these techniques are suitable for forming each of the various layers discussed herein. Those skilled in the art will appreciate that the teachings described herein are not limited by the technology used for the deposition process.

Insulating materials (e.g. dielectric materials) are used in microelectronic circuits to separate the conducting materials (e.g. interconnect lines and transistors) from each other to prevent unintended short circuits. As the transistors and circuits continue to scale to smaller dimensions, the space between the conducting materials also continues to shrink. Under these conditions, charge accumulates within the dielectric material and issues such as crosstalk, signal delay, and heat dissipation become an issue for circuit designers. Traditionally, silicon dioxide has been used as the dielectric material. Those having skill in the art will remember that silicon dioxide has a dielectric constant (i.e. k value) of 3.9. Replacing the silicon dioxide with dielectric materials having a lower k value (e.g. low-k materials) will reduce the issues associated with crosstalk, signal delay, and heat dissipation. Further, replacing the silicon dioxide with dielectric materials having a very low k value (e.g. k<2.5, so-called "ultra low-k" materials) will further reduce the issues associated with crosstalk, signal delay, and heat dissipation.

Copper (and its alloys) has been adopted as the primary conductor for use in microelectronic circuits. Copper is a fast diffusing species through most dielectric materials. Therefore, the copper conductors are typically encased in materials that are effective as diffusion barriers that act to retard the diffusion of the copper. Conductive metal nitride materials are examples of materials that are effective diffusion barriers to copper. Examples of conductive metal nitride materials include titanium nitride, tantalum nitride, titanium aluminum nitride, titanium silicon nitride, tantalum aluminum nitride, tantalum silicon nitride, tungsten nitride, and molybdenum nitride, among others.

Figure 1:
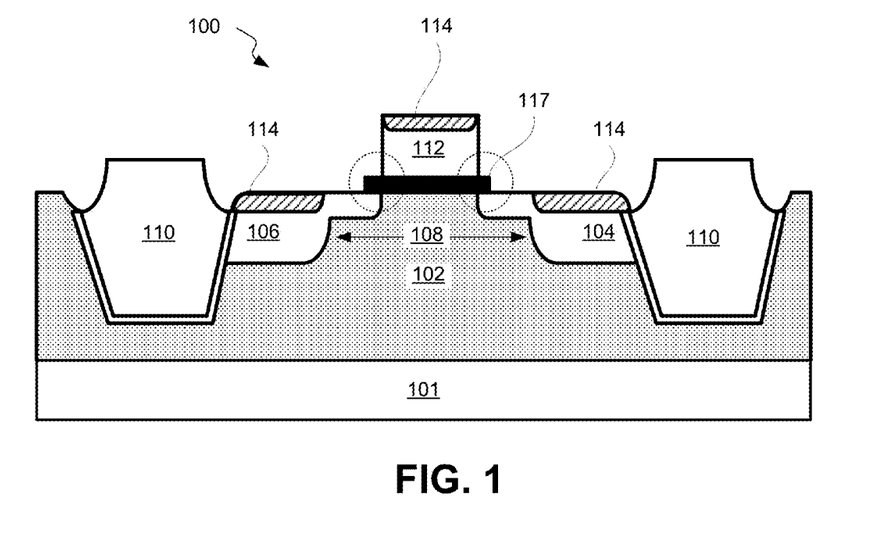
FIG. 1 illustrates a cross-sectional schematic diagram of a typical semiconductor device.

A brief description of semiconductor device examples is presented below to provide better understanding of various plasma surface treatments. Specifically, FIG. 1 illustrates a schematic representation of substrate portions including MOS device, 100, in accordance with some embodiments. The references below are made to positive metal-oxide semiconductor (PMOS) devices but other types of MOS devices can be used in the described processes and will be understood by one having ordinary skill in the art. MOS device 100 includes a p-doped substrate, 101, and an n-doped well, 102, disposed within substrate, 101. Substrate, 101, is typically a part of an overall wafer that may include other devices. Some of these devices may include silicon nitride, silicon oxide, polysilicon, or titanium nitride structures. P-doped substrate, 101, may include any suitable p-type dopants, such as boron and indium, and may be formed by any suitable technique. N-doped well, 102, may include any suitable n-type dopants, such as phosphorus and arsenic, and may be formed by any suitable technique. For example, n-doped well, 102, may be formed by doping substrate, 101, by ion implantation, for example.

MOS device, 100, also includes a conductive gate electrode, 112, that is separated from n-doped well, 102, by gate dielectric, 117. Gate electrode, 112, may include any suitable conductive material. In some embodiments, gate electrode, 112, may comprise polysilicon. In some embodiments, gate electrode, 112, may include polysilicon doped with a p-type dopant, such as boron. Gate dielectric, 117, is formed from a high-k material (e.g. hafnium oxide). Other dielectric materials include zirconium oxide or aluminum oxide. Typically, a semiconductor material with high mobility such as germanium or a silicon-germanium alloy (not shown) is formed beneath the gate dielectric.

MOS device, 100, also includes p-doped source region, 104, and drain region, 106, (or simply the source and drain) disposed in n-doped well, 102. Source, 104, and drain, 106, are located on each side of gate electrode, 112, forming channel, 108, within n-doped well, 102. Source, 104, and drain, 106, may include a p-type dopant, such as boron. Source, 104, and drain, 106, may be formed by ion implantation. After forming source, 104, and drain, 106, MOS device, 100, may be subjected to an annealing and/or thermal activation process.

In some embodiments, source, 104, drain, 106, and gate electrode, 112, are covered with a layer of self-aligned silicide portions, 114, which may be also referred to as salicide portions or simply salicides. For example, a layer of cobalt may be deposited as a blanket layer and then thermally treated to form these silicide portions, 114. Other suitable materials include nickel and other refractory metals, such as tungsten, titanium, platinum, and palladium. After forming the blanket layer from the suitable metal, the layer is subjected to rapid thermal process (RTP) to react the metal with silicon contained within gate electrode, 112, as well as within source, 104, and drain, 106, to form a metal silicide. The RTP process may be performed at 700° C. to 1000° C.

MOS device, 100, may also include shallow trench isolation (STI) structures, 110, disposed on both sides of source, 104, and drain, 106. STI structures, 110, may include liners formed on the side and bottom walls by, for example, thermal oxidation of silicon of n-doped well, 102. The main body of STI structures is formed by filling a trench within n-doped well, 102, with a dielectric material, such as silicon oxide. Silicon oxide may be filled using high density plasma (HDP) deposition process.

As shown in FIG. 1, gate dielectric, 117, may protrude beyond gate electrode, 112. As such, gate dielectric, 117, may need to be partially etched such that it does not extend past electrode, 112, and does not interfere with subsequent formation of liners and spacers on sidewalls of gate electrode, 112.

In some embodiments, the gate dielectric, 117, and/or the gate electrode, 112, may receive a surface plasma treatment to improve the performance of the device.

Figure 2:
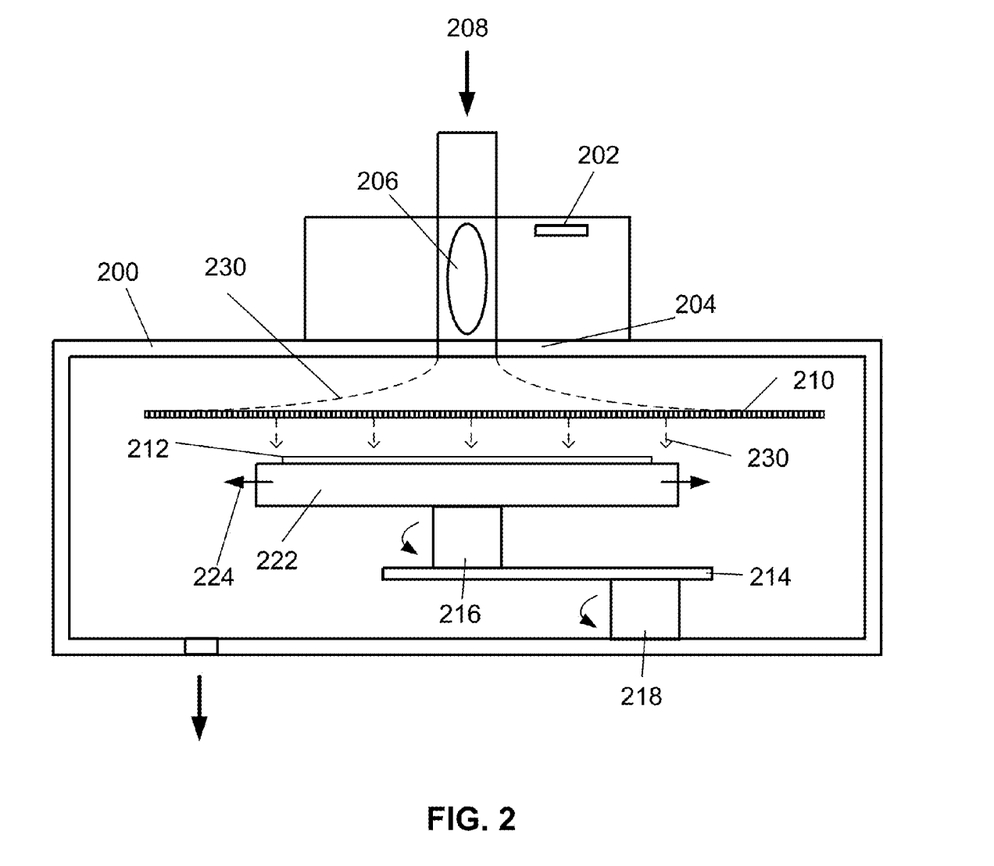
FIG. 2 illustrates a schematic diagram for plasma surface treatment according to some embodiments.

FIG. 2 illustrates the overall layout of some embodiments of a system enabling combinatorial processing using a remote plasma source. A discussion of the system may be found in co-owned U.S. patent application Ser. No. 13/328,129 filed on Dec. 16, 2011 which is herein incorporated by reference for all purposes. Portions of the '129 application are included herein to enhance the understanding of the present disclosure. A process chamber, 200, is provided. A remote plasma source, 202, is mounted on a chamber lid, 204, either directly as illustrated or through a short flange. The plasma, 206, is entrained into a central gas flow, 208, which is directed toward a showerhead, 210. The showerhead is disposed within the processing chamber between the remote plasma source and the substrate and is in close proximity to the substrate, 212. The showerhead further includes multiple regions, each region containing an inert gas port. The showerhead is operable to provide exposure of reactive species from the remote plasma source to regions of the substrate. A substrate positioning system, 214, can position the substrate, 212, directly under the showerhead, 210. As illustrated in FIG. 2, the substrate positioning system can provide two displaced axes of rotation, 216, and 218. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support, 222, may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

The substrate support, 222, can include a substrate heater (e.g., resistive or inductive) and can be sized to be larger than the largest substrate to be processed. Substrate temperatures for most remote plasma applications are less than 500 C, although any suitable heater power and range of temperature control. The substrate support, 222, can also be configured to provide a gas purge flow, 224, for example from the edges of the support, using argon, helium, or any other gas that is not reactive under the process conditions.

Figure 3:
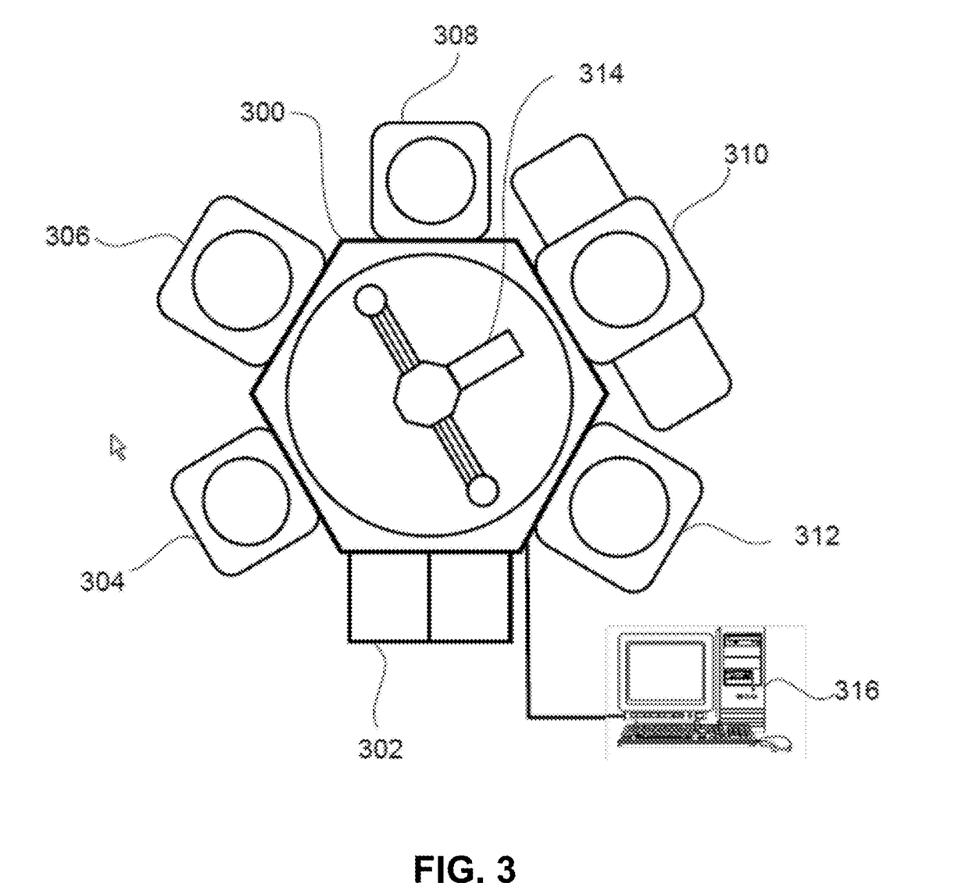
FIG. 3 illustrates a processing system enabling plasma surface treatment according to some embodiments.

FIG. 3 is a simplified schematic diagram illustrating an integrated processing system in accordance with some embodiments of the invention. The processing system includes a frame, 300, supporting a plurality of processing modules. It will be appreciated that frame, 300, may be a unitary frame in accordance with some embodiments. In some embodiments, the environment within frame, 300, is controlled. A load lock, 302, provides access into the plurality of modules of the processing system. A robot, 314, provides for the movement of substrates (and masks) between the modules and for the movement into and out of the load lock, 302. Modules, 304-312, may be any set of modules and preferably include one or more processing modules. For example, module, 304, may be an orientation/degassing module, module, 306, may be a clean module, either plasma or non-plasma based, modules, 308, and/or 310, may be dual purpose modules. Module, 312, may provide conventional clean or degas as necessary.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device, 316, may control the processes of the processing system. Further details of one possible processing system are described in U.S. application Ser. Nos. 11/672,478 and 11/672,473, the entire disclosures of which are herein incorporated by reference. In a processing system, a plurality of methods may be employed to deposit material upon a substrate.

Plasmas are widely used for a variety of treatment and layer deposition tasks in semiconductor fabrication. These applications include subtractive processes such as wafer precleaning, contaminant removal, native oxide removal, photoresist removal, as well as treatment processes such as oxidation, nitridation, or hydridation of a layer both during and after formation. "Remote" plasma sources are frequently used, where the plasma is located at some distance from the surface to be treated or substrate on which a layer is to be formed. The distance allows some adjusting of the charged particles in the plasma. For example, the density of ions and electrons can be adjusted by distance, the electrons and ions can be removed from the generated plasma using suitable electrode configurations such as a grounded metal showerhead, so that, for example, only atomic radicals and molecule radicals (but not ions) reach the substrate.

The plasma generator for a remote plasma source can use any known means of coupling energy into atoms or molecules to ionize them and create a plasma. The energy source can be, for example, electromagnetic energy such as microwaves, radio frequency energy, or lasers.

Typically, systems using remote plasma sources were designed to treat the entire area of a substrate, such as a 300 mm wafer. Combinatorial processing is difficult and expensive when the entire area of a substrate can only receive a single process variation. Some embodiments of the present invention overcome this limitation by providing a remote plasma source, an associated substrate positioning system, and a site isolation system that allows a selected region of a substrate to be processed while the remaining regions of the substrate are protected from exposure to the plasma and reactive radical species unless or until such exposure is intended.

Accordingly, an apparatus for processing using remote plasma exposure of a substrate is disclosed. The apparatus comprises an outer chamber containing: a remote plasma source, a showerhead, and a transport system comprising a substrate support and capable of positioning the substrate. The plasma exposure process parameters can be varied. The plasma exposure process parameters comprise one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

In some embodiments, methods of varying surface exposure to a plasma or reactive radical species are provided. The methods comprise exposing a substrate to a plasma or reactive radical species from a remote plasma source under a first set of process parameters, and exposing a substrate to a plasma or reactive radical species from a remote plasma source under a second set of process parameters. The process parameters can be varied in a combinatorial manner. Typically, the process parameters comprise one or more of source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, or combinations thereof.

In some embodiments, a layer can be exposed to a plasma surface treatment, thereby altering one or more of the layer's properties. Examples of suitable atoms (e.g. radicals) include O*, N*, Cl*, F*, H*, and the like. The atoms may be used to change the surface properties of materials present at the surface of the substrate. Examples of gases that may be used in the remote plasma source to generate the ions or reactive neutral species include $H_2$, $H_2O$, $O_2$, $N_2$, $N_2O$, $NH_3$, $BCl_3$, $NF_3$, and the like. The concentration and composition of the various species generated in the plasma may be varied by varying a number of the process parameters as well as the gas composition. A description of using these parameters to influence the concentration and composition of the various species generated in the plasma may be found in U.S. patent application Ser. No. 14/051,287, filed on Oct. 10, 2013, and claiming priority to U.S. Provisional Application No. 61/780,128, filed on Mar. 13, 2013, each of which is herein incorporated by reference for all purposes. An discussion of an example of the use of hydrogen for the cleaning and/or etching of oxide layers present on the surface of a semiconductor (e.g. silicon, germanium, or silicon-germanium alloys) may be found in U.S. patent application Ser. No. 14/031,975, filed on Sep. 19, 2013, and claiming priority to U.S. Provisional Application No. 61/779,740, filed on Mar. 13, 2013, each of which is herein incorporated by reference for all purposes.

Figure 4:
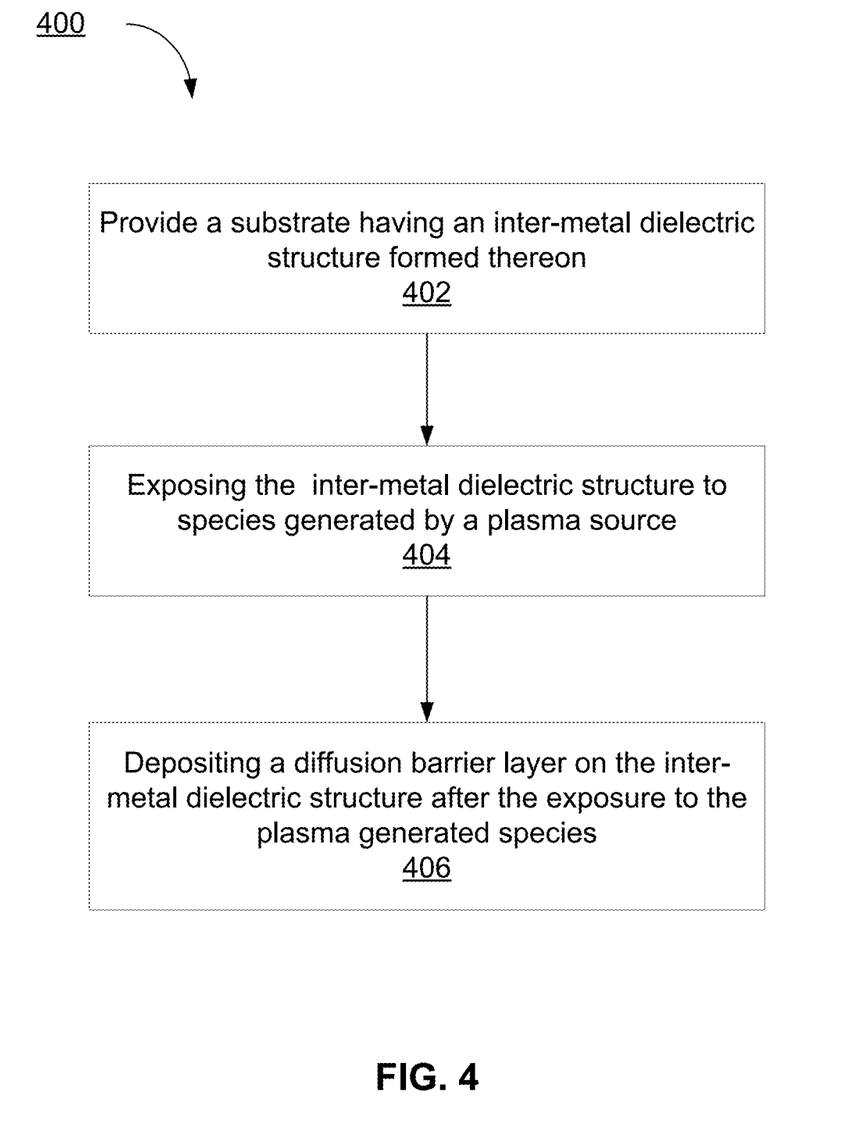
FIG. 4 illustrates a flow chart of a method according to some embodiments.

FIG. 4 illustrates a flow chart of a method according to some embodiments. In step 402, a substrate is provided having an IMD structure formed thereon. Typically, the IMD structure will include a dielectric layer in which openings such as trenches, vias, etc. are formed. The openings will be later filled with diffusion barrier materials and copper interconnect materials.

In step 404, the IMD structure is exposed to species generated by a plasma source. As discussed previously, the plasma source may include a remote plasma source or a direct plasma source. In some embodiments, the plasma source is a remote plasma source. The system and plasma source may be employed as described earlier. The species that are generated may include at least one of O, N, Cl, F, or H. Gases that may be used in the plasma source to generate the species include $H_2$, $H_2O$, $O_2$, $N_2$, $N_2O$, $NH_3$, $BCl_3$, or $NF_3$. Those skilled in the art will understand that inert gases such as helium, neon, argon, krypton, and xenon may also be introduced into the plasma. Generally, these species are not active in the modification of the surface unless a bias voltage is applied to the substrate and ions of these inert gases are accelerated toward the surface. In some embodiments, the species include hydrogen species or oxygen species. The hydrogen or oxygen species may be at least one of ions or neutral species. In some embodiments, the gas used to generate the hydrogen species includes hydrogen gas. In some embodiments, the gas used to generate the oxygen species includes oxygen gas.

In some embodiments, the species react with the IMD structure present on the surface of the substrate and effectively alter one or more of the layer's properties. In some embodiments, the species react with the IMD structure and form a surface that is more hydrophilic. In some embodiments, the species react with the IMD structure and passivate the surface with chemical moieties that are more reactive toward the precursors used to deposit subsequent layers.

In step 404, a diffusion barrier material is deposited above the dielectric material. The diffusion barrier material may be formed using any common deposition technique such as ALD, PE-ALD, AVD, UV-ALD, CVD, PECVD, or PVD. Generally, because of the complex morphology of the device interconnect structure, ALD, PE-ALD, AVD, or CVD are preferred methods of formation. In some embodiments, the deposition technique for depositing the diffusion barrier material is ALD. Conductive metal nitride materials are examples of materials that are effective diffusion barriers to copper. Examples of conductive metal nitride materials include titanium nitride, tantalum nitride, titanium aluminum nitride, titanium silicon nitride, tantalum aluminum nitride, tantalum silicon nitride, tungsten nitride, and molybdenum nitride, among others. In some embodiments, the diffusion barrier material is tantalum nitride.

Figure 5A:
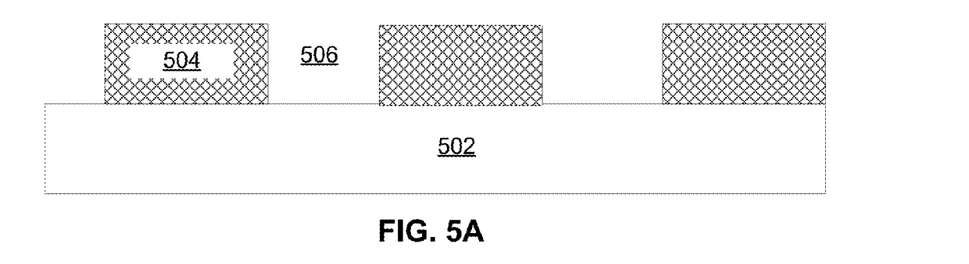
FIGS. 5A-5C illustrate schematic diagrams for plasma surface treatment according to some embodiments.
Figure 5B:
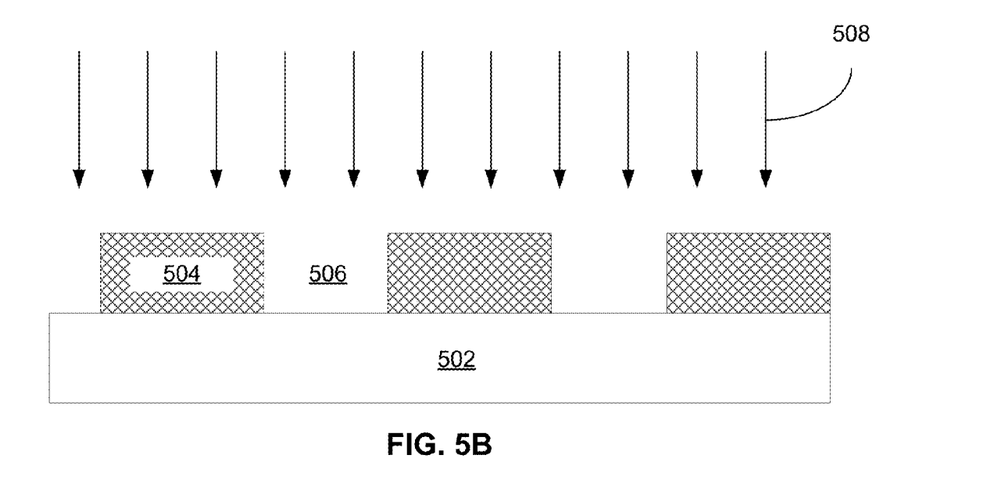
Figure 5C:
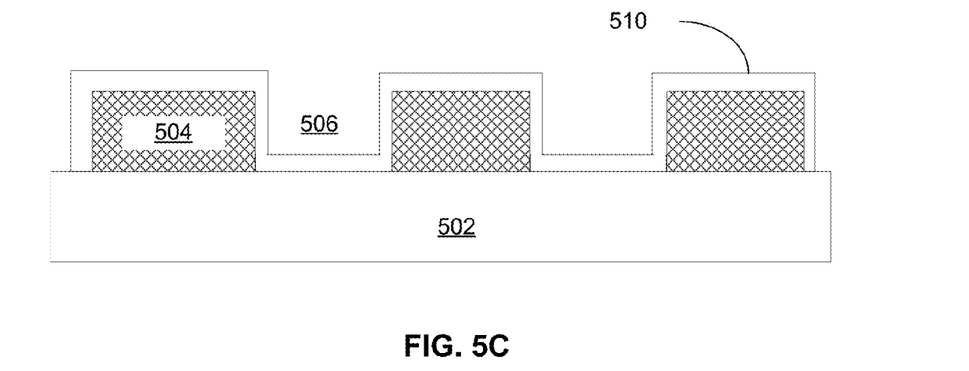

FIGS. 5A-5C illustrate schematic diagrams for plasma surface treatment according to some embodiments. In FIG. 5A, a substrate, 502, is provided that includes an IMD structure formed thereon. Those skilled in the art will understand that the substrate may include many layers, regions, and structures formed beneath the IMD structure. For brevity and clarity, these elements are not included (or shown) in the figures. The IMD structure is formed of a dielectric material, 504, and openings, 506, formed therein. The openings may be trenches, vias, etc. that are well known in the art. In some embodiments, the dielectric material is a low-k material. In some embodiments, the dielectric material is an ultra low-k material. Typically, low-k dielectric materials and ultra low-k dielectric materials are oxide materials or carbon-based polymeric materials. Typically, these types of materials are hydrophobic.

In FIG. 5B, the IMD structure (and the materials exposed by the openings) is exposed to species, 508, generated by a plasma source (not shown). As discussed previously, the plasma source may include a remote plasma source or a direct plasma source. In some embodiments, the plasma source is a remote plasma source. The system and plasma source may be employed as described earlier. The species that are generated may include at least one of O, N, CI, F, or H. Gases that may be used in the plasma source to generate the species include at least one of $H_2$, $H_2O$, $O_2$, $N_2$, $N_2O$, $NH_3$, $BCl_3$, or $NF_3$. Those skilled in the art will understand that inert gases such as helium, neon, argon, krypton, and xenon may also be introduced into the plasma. Generally, these species are not active in the modification of the surface unless a bias voltage is applied to the substrate and ions of these inert gases are accelerated toward the surface. In some embodiments, the species include hydrogen species or oxygen species. The hydrogen or oxygen species may be at least one of ions or neutral species. In some embodiments, the gas used to generate the hydrogen species includes hydrogen gas. In some embodiments, the gas used to generate the oxygen species includes oxygen gas.

In some embodiments, the species react with the IMD structure present on the surface of the substrate and effectively alter one or more of the layer's properties. In some embodiments, the species react with the IMD structure and form a surface that is more hydrophilic, relative to the untreated surface. In some embodiments, the species react with the IMD structure and passivate the surface with chemical moieties that are more reactive toward the precursors used to deposit subsequent layers.

In FIG. 5C, a diffusion barrier material, 510, is formed on the treated surfaces. The diffusion barrier material may be formed using any common deposition technique such as ALD, PE-ALD, AVD, UV-ALD, CVD, PECVD, or PVD. Generally, because of the complex morphology of the device interconnect structure, ALD, PE-ALD, AVD, or CVD are preferred methods of formation. In some embodiments, the deposition technique for depositing the diffusion barrier material is ALD. Conductive metal nitride materials are examples of materials that are effective diffusion barriers to copper. Examples of conductive metal nitride materials include titanium nitride, tantalum nitride, titanium aluminum nitride, titanium silicon nitride, tantalum aluminum nitride, tantalum silicon nitride, tungsten nitride, and molybdenum nitride, among others. In some embodiments, the diffusion barrier material is tantalum nitride.

Figure 6:
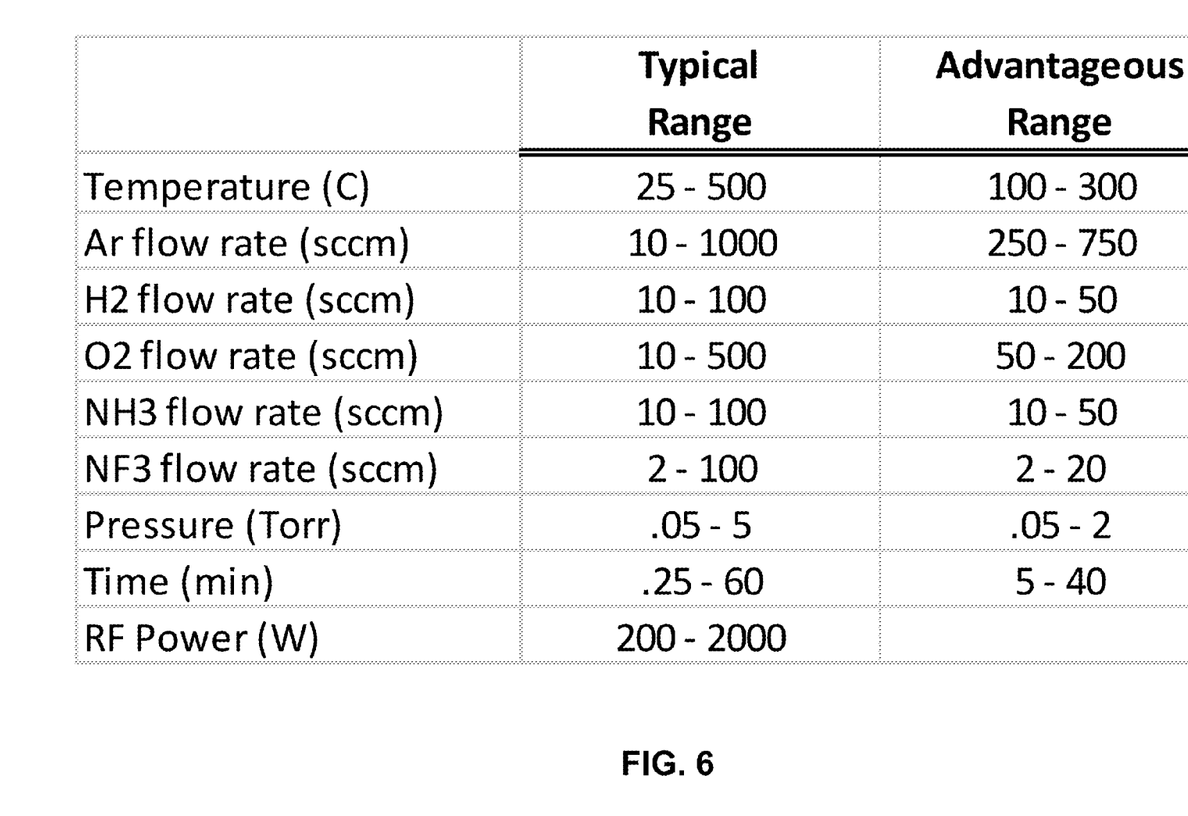
FIG. 6 provides a table of process parameters according to some embodiments.

FIG. 6 provides a table of process parameters according to some embodiments. The temperature may vary from about 25 C to about 500 C. Advantageously, the temperature is between about 100 C and about 300 C. The argon (or other inert gas) flow rate may vary between about 10 sccm and about 1000 sccm. Advantageously, the argon (or other inert gas) flow rate may vary between about 250 sccm and about 750 sccm. In some embodiments, hydrogen gas is used as the source of active species from the plasma. The hydrogen gas flow rate may vary from about 10 sccm to about 100 sccm. Advantageously, the hydrogen gas flow rate may vary between about 10 sccm and about 50 sccm. In some embodiments, oxygen gas is used as the source of active species from the plasma. The oxygen gas flow rate may vary from about 10 sccm to about 100 sccm. Advantageously, the oxygen gas flow rate may vary between about 10 sccm and about 50 sccm. In some embodiments, ammonia gas is used as the source of active species from the plasma. The ammonia gas flow rate may vary from about 10 sccm to about 100 sccm. Advantageously, the ammonia gas flow rate may vary between about 10 sccm and about 50 sccm. In some embodiments, nitrogen trifluoride gas is used as the source of active species from the plasma. The nitrogen trifluoride gas flow rate may vary from about 10 sccm to about 100 sccm. Advantageously, the nitrogen trifluoride gas flow rate may vary between about 10 sccm and about 50 sccm. The pressure may vary between about 50 mTorr and about 5 Torr. Advantageously, the pressure is between about 50 mTorr and about 2 Torr. The surface may be exposed to the reactive species for times between a few seconds (e.g. 25 seconds) to 60 minutes. Typically, the exposure time is on the order of minutes. Advantageously, the exposure time is between about 5 minutes and about 40 minutes. The plasma power may vary between 200 and 2000 watts. Advantageously, the plasma power may vary between 500 and 1500 watts. The plasma power generation may be one of RF, DC, or pulsed DC.

In some embodiments, hydrogen was used as the active species for the treatment of the low-k dielectric material. The process conditions employed an argon flow rate of between 50 and 150 sccm. The process conditions employed a hydrogen flow rate of between 10 and 30 sccm. The process conditions employed a pressure of between 0.25 and 0.75 Torr. The process conditions employed an RF plasma power of between 750 and 1250 Watts. The process conditions employed a substrate temperature setpoint of between 150 C and 210 C. The process conditions employed an exposure time of between 5 and 15 minutes.

Samples that included a low-k dielectric layer at a thickness of about 3100 A were exposed to active hydrogen species generated from plasma processes that covered the ranges in process parameters discussed previously (as used herein, "A" denotes an Angstrom unit=0.1 nm). A variety of material and surface properties were measured before and after the surface treatment. The thickness of the layer was monitored using ellipsometry. The composition of the layer was monitored using x-ray fluorescence (XRF). The bonding of the chemical species within the low-k dielectric layer and at the surface of the low-k dielectric layer was monitored using attenuated total reflection-Fourier transform infrared spectroscopy (ATR-FTIR). The hydrophobic nature of the surface of the low-k dielectric layer was monitored by measuring the contact angle of water droplets formed on the surface of the low-k dielectric layer. The k value of the low-k dielectric layer was monitored by measuring the capacitance of the layer using a mercury probe.

The data indicated that the surface treatment using hydrogen species did not affect the thickness of the low-k dielectric layer. The average thickness increased from about 3141 A before the treatment to about 3153 A after the treatment (~13 A change, <1% change). The data indicate that the surface treatment using hydrogen species did not affect the contact angle of the low-k dielectric layer. The average contact angle increased from about 40.3 degrees to about 43.2 degrees after the treatment (~2 degree change, ~5% change). The data indicate that the surface treatment using hydrogen species did affect the k value of the low-k dielectric layer. The average k value increased from about 2.37 to about 2.85 after the treatment (~0.5 change in k value, ~20% change).

Figure 7:
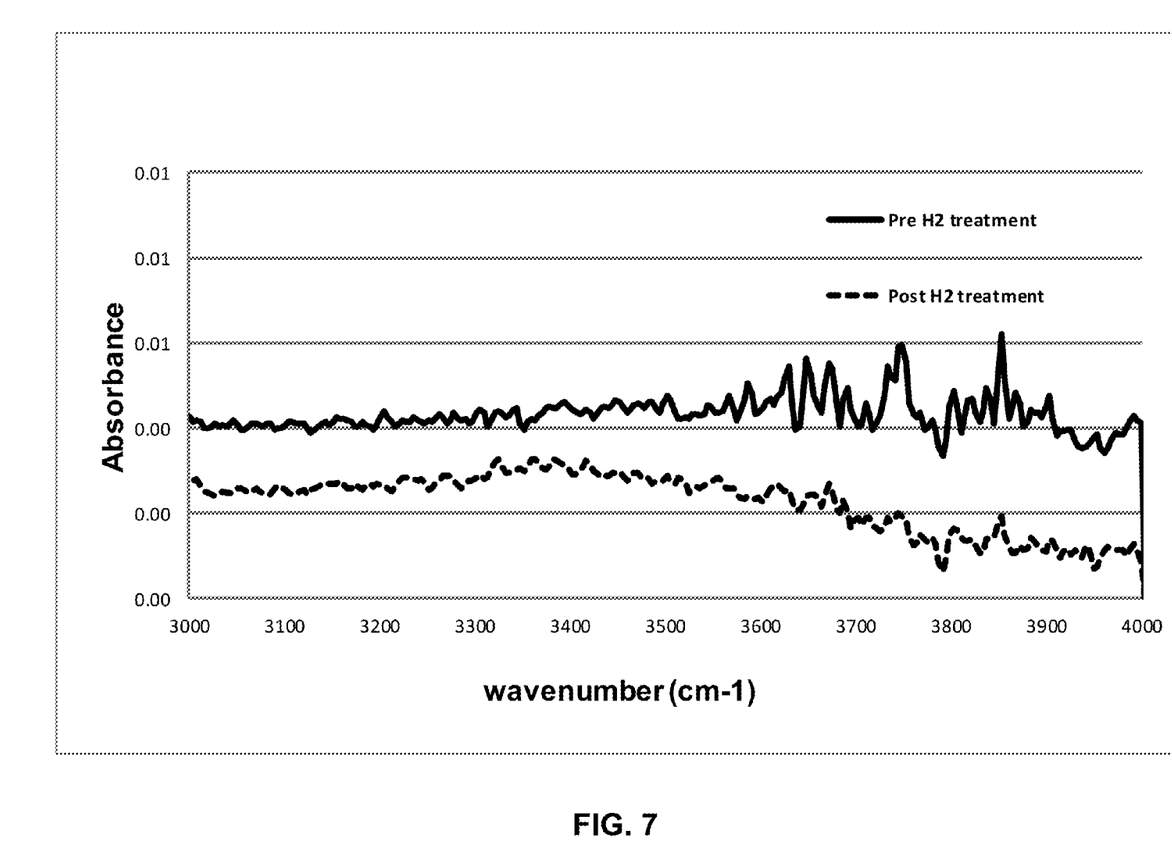
FIG. 7 presents FTIR data of absorbance versus wavenumber for low-k films treated according to some embodiments.

FIG. 7 presents FTIR data of absorbance versus wavenumber for low-k layers treated according to some embodiments. There is a silicon-oxygen-hydrogen (e.g. Si—OH) stretch that falls between about 3200 $cm^{-1}$ and about 3700 $cm^{-1}$. Exposure of an oxide surface (e.g. a typical low-k material) to active hydrogen species generated from a plasma may lead to an increase in Si—OH bonds in the near surface region of the low-k dielectric layer. The data for the low-k dielectric layer before the surface treatment with active hydrogen species is illustrated with the solid line. These data indicate almost no absorbance relative to the background (e.g. an average value of the absorbance between about 3000 $cm^{-1}$ and about 3200 $cm^{-1}$). The data for the low-k dielectric layer after the surface treatment with active hydrogen species is illustrated with the dashed line. These data indicate an increase in the absorbance relative to the background (e.g. an average value of the absorbance between about 3000 $cm^{-1}$ and about 3200 $cm^{-1}$). These data indicate that an increase in the number of Si—OH moieties is present at the surface of the low-k dielectric layer.

In some embodiments, oxygen was used as the active species for the treatment of the low-k dielectric material. The process conditions employed an oxygen flow rate of between 50 and 150 sccm. The process conditions employed a pressure of between 0.05 and 0.10 Torr. The process conditions employed an RF plasma power of between 500 and 1100 Watts. The process conditions employed a substrate temperature setpoint of between 150 C and 210 C. The process conditions employed an exposure time of between 5 and 15 minutes.

Samples that included a low-k dielectric layer at a thickness of about 3100 A were exposed to active oxygen species generated from plasma processes that covered the ranges in process parameters discussed previously. A variety of material and surface properties were measured before and after the surface treatment. The thickness of the layer was monitored using ellipsometry. The composition of the layer was monitored using x-ray fluorescence (XRF). The bonding of the chemical species within the low-k dielectric layer and at the surface of the low-k dielectric layer was monitored using attenuated total reflection-Fourier transform infrared spectroscopy (ATR-FTIR). The hydrophobic nature of the surface of the low-k dielectric layer was monitored by measuring the contact angle of water droplets formed on the surface of the low-k dielectric layer. The k value of the low-k dielectric layer was monitored by measuring the capacitance of the layer using a mercury probe.

The data indicate that the surface treatment using oxygen species did not affect the thickness of the low-k dielectric layer. The average thickness decreased from about 3201 A before the treatment to about 3141 A after the treatment (~60 A change, <2% change). The data indicate that the surface treatment using oxygen species had a significant effect on the contact angle of the low-k dielectric layer. The average contact angle decreased from about 40.3 degrees to about 19.4 degrees after the treatment (~21 degree change, ~50% change). The data indicate that the surface treatment using oxygen species did affect the k value of the low-k dielectric layer. The average k value increased from about 2.36 to about 2.80 after the treatment (~0.5 change in k value, ~20% change).

Figure 8:
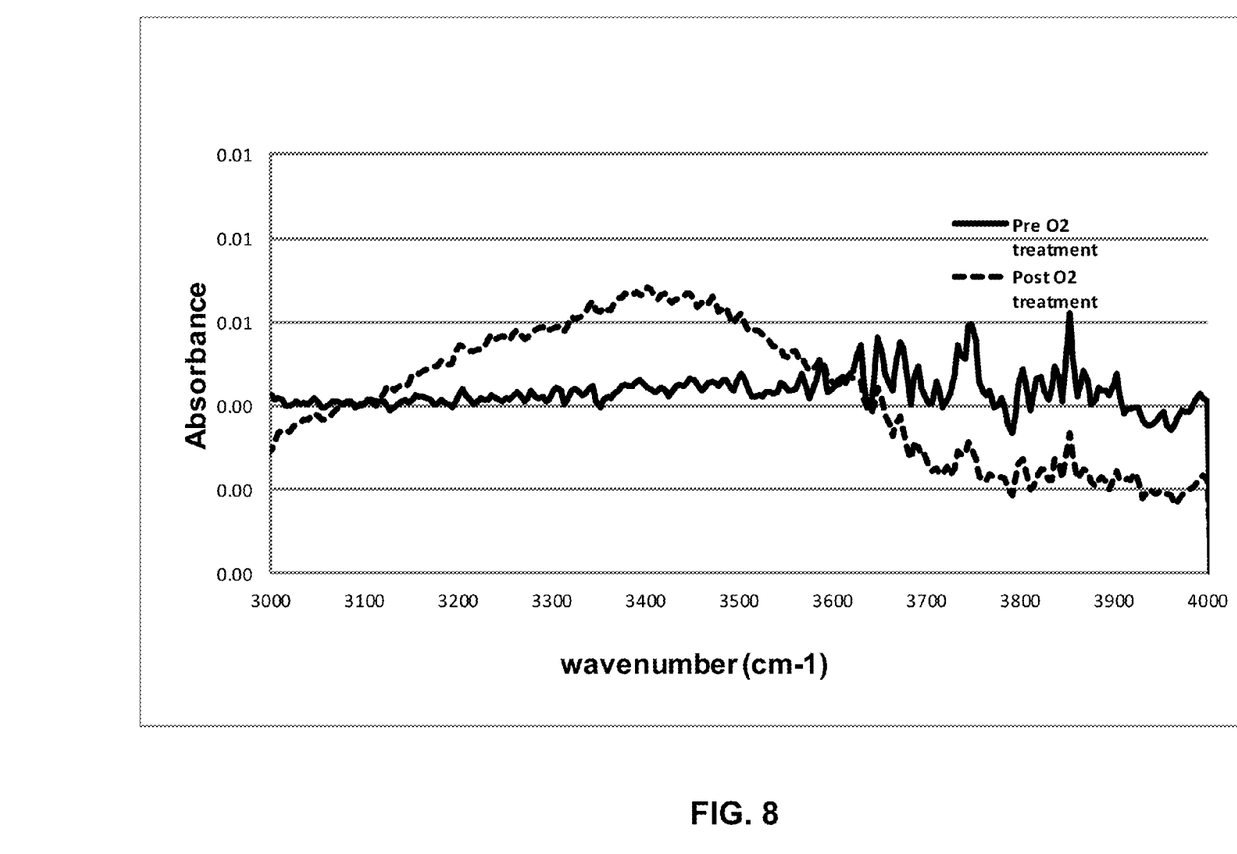
FIG. 8 presents FTIR data of absorbance versus wavenumber for low-k films treated according to some embodiments.

FIG. 8 presents FTIR data of absorbance versus wavenumber for low-k layers treated according to some embodiments. There is a silicon-oxygen-hydrogen (e.g. Si—OH) stretch that falls between about 3200 $cm^{-1}$ and about 3700 $cm^{-1}$. Exposure of an oxide surface (e.g. a typical low-k material) to active oxygen species generated from a plasma may lead to an increase in Si—OH bonds in the near surface region of the low-k dielectric layer. The data for the low-k dielectric layer before the surface treatment with active hydrogen species is illustrated with the solid line. These data indicate almost no absorbance relative to the background (e.g. an average value of the absorbance between about 3000 $cm^{-1}$ and about 3200 $cm^{-1}$). The data for the low-k dielectric layer after the surface treatment with active oxygen species is illustrated with the dashed line. These data indicate an increase in the absorbance relative to the background (e.g. an average value of the absorbance between about 3000 $cm^{-1}$ and about 3200 $cm^{-1}$). These data indicate that an increase in the number of Si—OH moieties is present at the surface of the low-k dielectric layer.

As discussed previously, a diffusion barrier layer is typically deposited prior to copper as part of the IMD structure. Generally, because of the complex morphology of the device interconnect structure, PVD, ALD, PE-ALD, AVD, or CVD are preferred methods of formation. In some embodiments, the deposition technique for depositing the diffusion barrier material is ALD. Conductive metal nitride materials are examples of materials that are effective diffusion barriers to copper. Examples of conductive metal nitride materials include titanium nitride, tantalum nitride, titanium aluminum nitride, titanium silicon nitride, tantalum aluminum nitride, tantalum silicon nitride, tungsten nitride, and molybdenum nitride, among others. In some embodiments, the diffusion barrier material is tantalum nitride.

In the first step of the ALD deposition of the diffusion barrier material, the surface is exposed to a metal precursor molecule. Typically, the metal precursor molecule is an organometallic molecule. The metal precursor molecules are delivered into the reaction chamber as a pulse and allowed to interact with the substrate. The metal precursor molecules must react with active sites on the surface of the dielectric layer that forms part of the IMD structure to lead to deposition. The coverage of the metal precursor molecules on the surface may be less than 100% (e.g. the effective thickness of the deposited layer may be less than one monolayer). The lack of 100% coverage may be due to some of the active sites being blocked by other species, steric hindrance between the ligands of neighboring metal precursor molecules, or other reasons. In the next step of the ALD deposition, excess and/or unreacted metal precursor molecules are purged from the reaction chamber using a nonreactive gas (e.g. argon, helium, nitrogen, etc.). In the next step of the ALD deposition, the surface is exposed to a reactive gas (e.g. an oxidant, reductant, nitriding agent, etc.). The reactive gas must react with the adsorbed metal precursor molecules to lead to deposition. In the next step of the ALD deposition, excess and/or unreacted reactant gas is purged from the reaction chamber using a nonreactive gas (e.g. argon, helium, nitrogen, etc.). This completes a single cycle of the ALD deposition. This cycle may result in a deposition of material that is less than a single monolayer in thickness. This cycle can be repeated as often as required until a desired thickness of the diffusion barrier layer if formed.

If the thickness of the diffusion barrier layer is plotted as a function of the number of ALD cycles, the plot should be a straight line where the slope gives the deposition rate (in units of A/cycle) and the y-intercept should be zero. Generally, deviations from a straight line indicate that the deposition is not self-limiting (e.g. not a true ALD deposition) and includes a typical CVD component. Generally, if the y-intercept is not zero, then there is a nucleation delay where the first few cycles of the ALD deposition do not lead to deposited material.

Tantalum nitride diffusion barrier layers were deposited on low-k dielectric layers using ALD. A first sample included a low-k dielectric material that had no surface treatment or precleaning. A second sample included a low-k dielectric material that had been chemically cleaned using a dilute hydrofluoric acid solution prior to the tantalum nitride diffusion barrier layer deposition.

Figure 9:
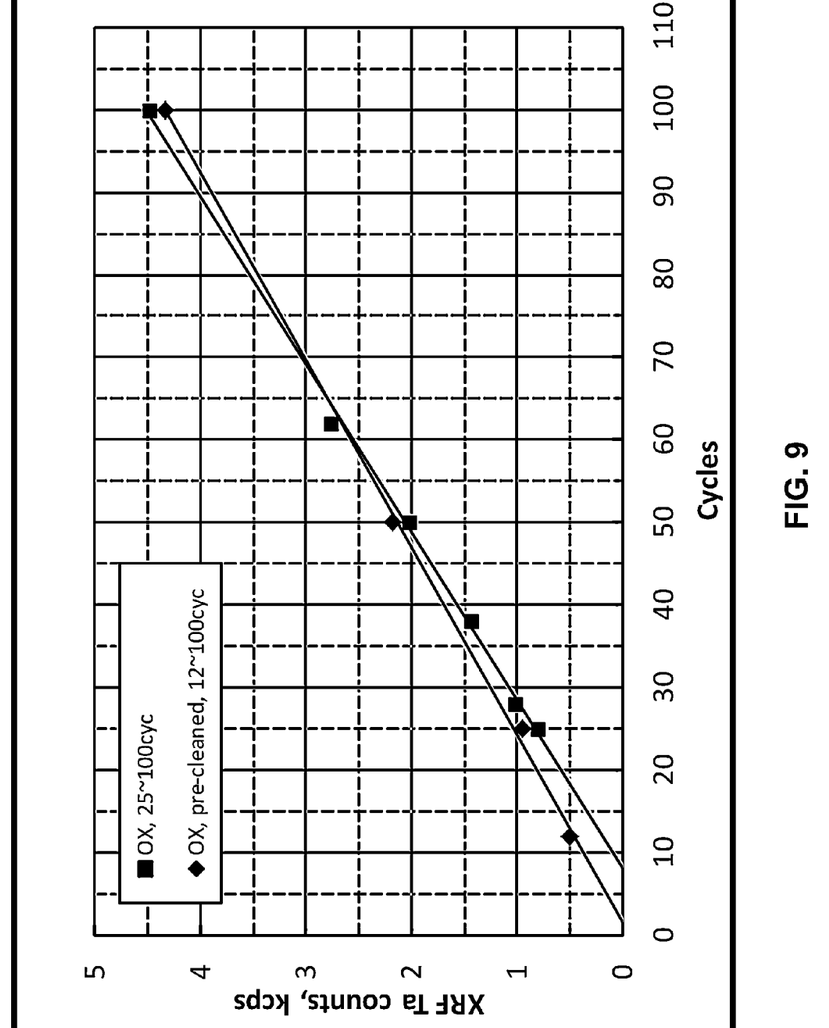
FIG. 9 presents a data for XRF counts versus number of cycles as an illustration of nucleation delay according to some embodiments.

FIG. 9 presents a data for XRF counts (kilo counts per second (kcps)) versus number of cycles as an illustration of nucleation delay according to some embodiments. The XRF counts on the y-axis correspond to emission from tantalum, and thus can be used as a proxy for the thickness of the layer. For these data, 1.1 kcps correspond to about 10 A of tantalum nitride.

The data illustrated using the square symbols are for the sample without the chemical precleaning treatment. These data indicate a linear relationship with a deposition rate of about 0.0485 kcps/cycle (i.e. ~0.44 A/cycle). These data also indicate that there is a delay of about 10 cycles before the deposition of the tantalum nitride begins. This nucleation delay may vary over time, and may lead to inconsistent results and poor control in a manufacturing environment.

The data illustrated using the diamond symbols are for the sample with the chemical precleaning treatment. These data indicate a linear relationship with a deposition rate of about 0.0441 kcps/cycle (i.e. ~0.40 A/cycle). These data also indicate that there is essentially no delay (i.e. less than 3 cycles) before the deposition of the tantalum nitride begins. This lack of a nucleation delay may lead to more consistent results and improved control in a manufacturing environment. These data indicate that the deposition of the diffusion barrier layer can be affected by the condition of the surface of the low-k dielectric material.

Tantalum nitride diffusion barrier layers were deposited on low-k dielectric layers using ALD. A first sample included a low-k dielectric material that had no surface treatment or precleaning. A second sample included a low-k dielectric material that had been exposed to a hydrogen plasma pretreatment as discussed previously prior to the tantalum nitride diffusion barrier layer deposition. A third sample included a low-k dielectric material that had been exposed to an oxygen plasma pretreatment as discussed previously prior to the tantalum nitride diffusion barrier layer deposition.

Figure 10:
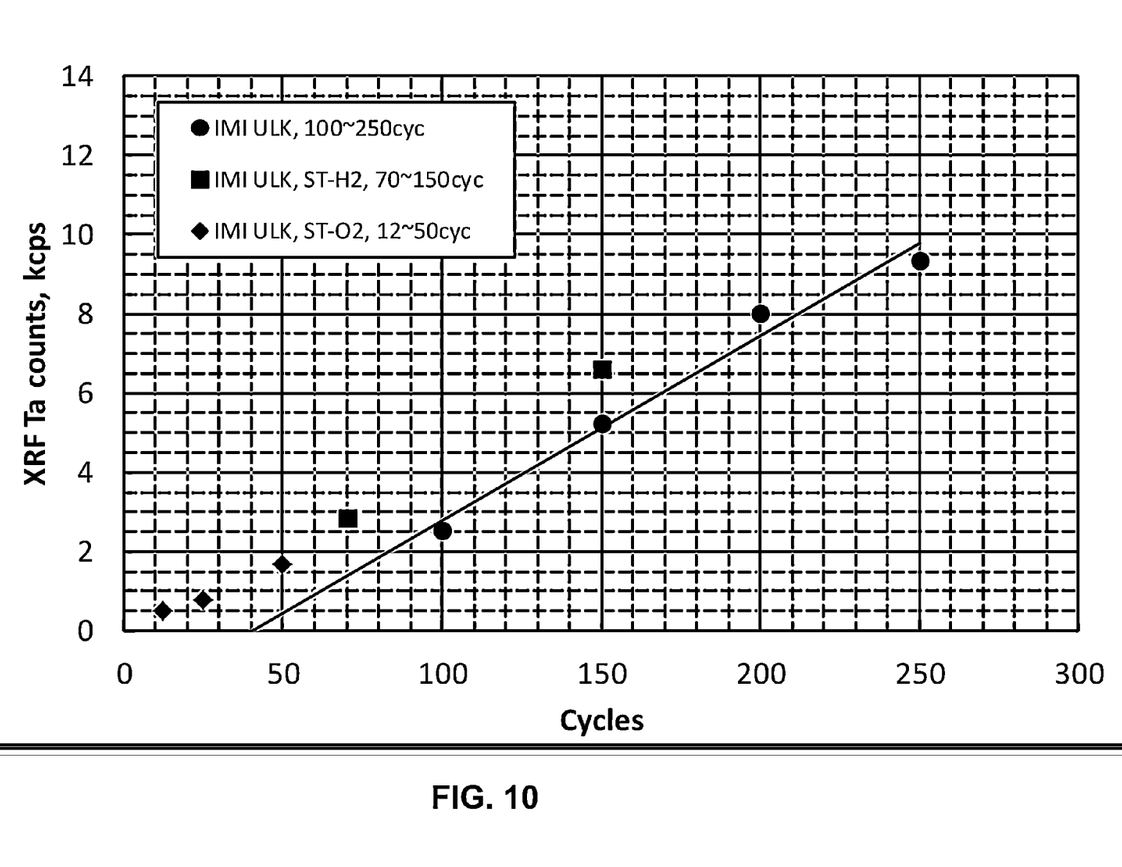
FIG. 10 presents a data for XRF counts versus number of cycles as an illustration of nucleation delay according to some embodiments.

FIG. 10 presents a data for XRF counts (kilo counts per second (kcps)) versus number of cycles as an illustration of nucleation delay according to some embodiments. The XRF counts on the y-axis are used as a proxy for the thickness of the layer. The XRF counts on the y-axis correspond to emission from tantalum. For these data, 1.1 kcps correspond to about 10 A of tantalum nitride.

The data illustrated using the circle symbols are for the sample without the surface treatment or precleaning. These data indicate a linear relationship with a deposition rate of about 0.0485 kcps/cycle (i.e. ~0.44 A/cycle). These data also indicate that there is a delay of about 40 cycles before the deposition of the tantalum nitride begins. This nucleation delay may vary over time, and may lead to inconsistent results and poor control in a manufacturing environment.

The data illustrated using the square symbols are for the sample with the hydrogen plasma pretreatment as discussed previously. These data indicate a linear relationship with a deposition rate of about 0.0441 kcps/cycle (i.e. ~0.40 A/cycle). These data also indicate that there is a delay of about 15 cycles before the deposition of the tantalum nitride begins. This reduced nucleation delay may lead to more consistent results and improved control in a manufacturing environment. These data indicate that the deposition of the diffusion barrier layer can be affected by the condition of the surface of the low-k dielectric material.

The data illustrated using the diamond symbols are for the sample with the oxygen plasma pretreatment as discussed previously. These data indicate a linear relationship with a deposition rate of about 0.0441 kcps/cycle (i.e. ~0.40 A/cycle). These data also indicate that there is a delay of about <5 cycles before the deposition of the tantalum nitride begins. This reduced nucleation delay may lead to more consistent results and improved control in a manufacturing environment. These data indicate that the deposition of the diffusion barrier layer can be affected by the condition of the surface of the low-k dielectric material.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method comprising:
providing a substrate having an inter-metal dielectric layer formed thereon;
exposing a surface of the inter-metal dielectric layer to activated species to treat the surface of the inter-metal dielectric layer,
wherein the activated species are generated using a plasma source,
wherein the activated species comprises at least one of Cl or F, and
wherein exposing the surface of the inter-metal dielectric layer to the activated species increases reactivity of the surface of the inter-metal dielectric toward one or more atomic layer deposition (ALD) precursors; and
after the exposing, depositing a diffusion barrier layer on the surface of the inter-metal dielectric layer using an atomic layer deposition (ALD) process and supplying the one or more atomic layer deposition (ALD) precursors,
wherein the one or more atomic layer deposition (ALD) precursors comprises at least one of aluminum or molybdenum,
wherein a nucleation delay for the ALD process is less than 5 cycles.

2. The method of claim 1, wherein the inter-metal dielectric layer comprises at least one of a low-k layer or an ultra low-k layer.

3. The method of claim 1, wherein a gas used to generate the activated species comprises at least one of $BCl_3$ or $NF_3$.

4. The method of claim 1, wherein the exposing is performed at a temperature between 25 C and 500 C.

5. The method of claim 4, wherein the exposing is performed at a temperature between 100 C and 300 C.

6. The method of claim 1, wherein the exposing is performed in an atmosphere comprising flowing argon at a rate between 10 sccm and 1000 sccm.

7. The method of claim 6, wherein the argon is flowed at a rate between 250 sccm and 750 sccm.

8. The method of claim 1, wherein the exposing is performed at a pressure between 0.05 Torr and 5 Torr.

9. The method of claim 8, wherein the exposing is performed at a pressure between 0.05 Torr and 2 Torr.

10. The method of claim 1, wherein the exposing is performed for a time between 0.25 minutes and 60 minutes.

11. The method of claim 1, wherein nucleation delay for the ALD process is less than 3 cycles.

12. A method comprising:
   providing a substrate having an inter-metal dielectric layer formed thereon,
      wherein the inter-metal dielectric layer comprises one of a low-k layer or an ultra low-k layer;
   exposing a surface of the inter-metal dielectric layer to activated species to treat the surface of the inter-metal dielectric layer,
      wherein the activated species are generated using a plasma source,
      wherein the activated species comprises at least one of Cl or F, and
      wherein exposing the surface of the inter-metal dielectric layer to the activated species increases reactivity of the surface of the inter-metal dielectric toward one or more atomic layer deposition (ALD) precursors; and
   after the exposing, depositing a diffusion barrier layer on the surface of the treated inter-metal dielectric layer using an atomic layer deposition (ALD) process and supplying the one or more atomic layer deposition (ALD) precursors,
   wherein a nucleation delay for the ALD process is less than 5 cycles,
   wherein the diffusion barrier layer comprises at least one of aluminum or molybdenum.

13. The method of claim 12, wherein the exposing is performed for a time between 0.25 minutes and 60 minutes.

14. The method of claim 12, wherein the exposing is performed at a temperature between 100 C and 500 C.

* * * * *